(12) United States Patent
Tano et al.

(10) Patent No.: US 8,049,211 B2
(45) Date of Patent: Nov. 1, 2011

(54) LAMINATE STRUCTURE AND ITS MANUFACTURING METHOD, INCLUDING WETTABILITY VARIABLE LAYER OF MATERIAL OF VARIABLE CRITICAL SURFACE TENSION

(75) Inventors: Takanori Tano, Kanagawa (JP); Koei Suzuki, Kanagawa (JP); Yusuke Tsuda, Fukuoka (JP)

(73) Assignee: Ricoh Company, Ltd., Tokyo (JP)

( * ) Notice: Subject to any disclaimer, the term of this patent is extended or adjusted under 35 U.S.C. 154(b) by 140 days.

(21) Appl. No.: 12/526,840

(22) PCT Filed: Mar. 5, 2008

(86) PCT No.: PCT/JP2008/054421
§ 371 (c)(1),
(2), (4) Date: Aug. 12, 2009

(87) PCT Pub. No.: WO2008/126574
PCT Pub. Date: Oct. 23, 2008

(65) Prior Publication Data
US 2010/0072463 A1   Mar. 25, 2010

(30) Foreign Application Priority Data
Mar. 14, 2007   (JP) .................................. 2007-065592

(51) Int. Cl.
H01L 51/05   (2006.01)
(52) U.S. Cl. .............................. 257/40; 257/779; 347/41
(58) Field of Classification Search .................... 257/40, 257/779; 347/5, 9, 10, 11, 12, 14, 15, 19, 347/20, 23, 41, 42, 43, 44, 46, 47, 50, 51, 347/57, 59
See application file for complete search history.

(56) References Cited

U.S. PATENT DOCUMENTS
2003/0068581 A1   4/2003   Kawamura et al.

FOREIGN PATENT DOCUMENTS
| JP | 2003-76004 | 3/2003 |
| JP | 2005-39086 | 2/2005 |
| JP | 2005-310962 | 11/2005 |
| JP | 2006-60113 | 3/2006 |
| JP | 2006060113 A * | 3/2006 |
| JP | 2008-41951 | 2/2008 |

OTHER PUBLICATIONS

English Translation of JP 2006060113 A, generated Feb. 26, 2011.*

(Continued)

*Primary Examiner* — Thomas L Dickey
(74) *Attorney, Agent, or Firm* — Cooper & Dunham LLP

(57) ABSTRACT

A disclosed laminate structure is capable of having its surface free energy changed with a small amount of UV irradiation. The invention also discloses a method of manufacturing the laminate structure; an electronic device having the laminate structure; an electronic device array having a plurality of the electronic devices; and a display apparatus having the electronic device array. The laminate structure includes a substrate 11, a wettability variable layer 12 disposed on the substrate, and a conducting layer 13 patterned on the wettability variable layer 12. The wettability variable layer 12 includes a material whose critical surface tension varies upon application of energy. The material with variable critical surface tension has a main chain and a side chain. The side chain has two or more sites of which the bond is cleaved upon absorption of energy.

17 Claims, 6 Drawing Sheets

OTHER PUBLICATIONS

Wada, Takatsugu, et al., "IJ formation of Organic TFT's narrow channel, using UV patterned Alignment Thin Film", 31P-yy-5, Canon, Inc., Research Laboratory of Printing Technologies (2005).

Feb. 28, 2011 Korean official action (with English translation) in connection with a counterpart Korean patent application.

* cited by examiner

LAMINATE STRUCTURE AND ITS MANUFACTURING METHOD, INCLUDING WETTABILITY VARIABLE LAYER OF MATERIAL OF VARIABLE CRITICAL SURFACE TENSION

TECHNICAL FIELD

The present invention relates to laminate structures, laminate structure manufacturing methods, electronic devices, electronic device arrays, and display apparatuses.

BACKGROUND ART

Vigorous research is being conducted on organic thin-film transistors that employ organic semiconductor materials. Advantages of using an organic semiconductor material in a transistor include flexibility, areal increase, process simplification due to a simple layer structure, and inexpensive manufacturing equipment.

Organic thin-film transistors can be also manufactured so inexpensively by a print method as to be beyond comparison with conventional Si-based semiconductor devices. Thin-films or circuits can also be easily formed using a print method, a spin-coating method, or a dipping method, for example.

One of the parameters that indicate the characteristics of such an organic thin-film transistor is the current on/off ratio ($I_{on}/I_{off}$). In an organic thin-film transistor, a current $I_{ds}$ that flows between the source and drain electrodes in a saturation region is expressed by $$I_{ds} = \mu C_{in} W(V_G - V_{TH})^2 / 2L \quad \text{(Equation 1)}$$

where $\mu$ is field-effect mobility, $C_{in}$ is the capacitance per unit area of the gate insulating film, W is the channel width, L is the channel length, $V_G$ is the gate voltage, and $V_{TH}$ is the threshold voltage. $C_{in}$ is expressed by $$C_{in} = \epsilon \epsilon_0 / d$$

where $\epsilon$ is the relative permittivity of the gate insulating film, $\epsilon_0$ is the permittivity of vacuum, and d is the thickness of the gate insulating film.

It can be seen from Equation (1) that in order to increase the on-current, it is effective to:
1. Improve the field-effect mobility;
2. Reduce the channel length; or
3. Increase the channel width, for example.

The field-effect mobility largely depends on material characteristics, and material development is underway to improve mobility.

On the other hand the channel length is determined by the device structure, and attempts are being made to improve the on-current by devising various device structures. Generally, the distance between source and drain electrodes is reduced to reduce the channel length.

Since organic semiconductor materials do not have a large field-effect mobility, the channel length is usually made 10 μm or smaller and preferably 5 μm or smaller. One method of accurately reducing the source-drain electrode distance is photolithography used in Si process. This process consists of the following steps:
1. Coat a substrate having a thin-film layer with a photoresist layer (resist coating).
2. Remove solvent by heating (prebaking).
3. Irradiate UV light via a hard mask that is patterned in accordance with pattern data, using a laser or an electron beam (exposure).
4. Remove the resist at an exposed portion with an alkali solution (development).
5. Cure the resist at an unexposed portion (a pattern portion) by heating (post baking).
6. Remove the thin-film layer where there is no resist by dipping in an etching solution or exposing to an etching gas (etching).
7. Remove the resist with an alkali solution or oxygen radical (resist stripping).

The above process is repeated after the formation of each thin-film layer to complete an active element. The process, however, requires expensive equipment and takes a long time, thus increasing cost.

In order to reduce manufacturing cost, attempts have been made to form an electrode pattern by a print method, such as an ink-jet print method. Ink-jet print method enables direct drawing of an electrode pattern, whereby the material-use ratio can be increased and, possibly, the manufacturing process can be simplified and cost reduction can be achieved. However, given that it is difficult to reduce the ink discharge quantity with the ink-jet print method, and in the light of landing accuracy which depends on mechanical errors or the like, it is difficult to form a pattern of 30 μm or smaller. Thus, it has been difficult to fabricate a very fine-resolution device using the ink-jet print method alone. Therefore, some technique must be devised in order to fabricate a very fine-resolution device. One example of such a technique involves manipulating the surface on which ink is caused to land.

Patent Document 1 discloses a method that utilizes a gate insulating film formed of a material whose critical surface tension (also referred to as "surface free energy") is changed by supplying energy such as UV light. Specifically, a site on an insulating film surface where an electrode is to be fabricated is irradiated with UV light, so as to form a region with an increased surface free energy. Then, an aqueous ink that contains an electrode material is applied by an ink jet method, whereby an electrode is formed in the region with increased surface free energy. In this way, a very fine-resolution electrode pattern can be formed on a gate insulating film. In this method, even if the ink lands at a boundary between the high surface free energy region and the low surface free energy region, the ink moves toward the side of the higher surface free energy due to the difference in surface free energy. As a result, a pattern having a uniform line can be formed, thus enabling the formation of electrode intervals of 5 μm or smaller. However, since the material whose surface free energy changes has a low optical sensitivity, the method requires UV irradiation in amounts greater than 10 J/cm². The method therefore takes a long irradiation time even with a high-output UV light lamp. As a result, takt time becomes longer and it becomes impossible to simplify the manufacturing process or reduce cost.

Non-Patent Document 1 discloses that a film made of a material whose surface free energy is changed by UV light is layered on a gate insulating film. After a region having a different surface free energy is formed on this film by UV irradiation, as in Patent Document 1, an electrode pattern is formed by an ink jet method. However, the formation of a layered structure prevents simplification of the manufacturing process. Furthermore, as in Patent Document 1, since the material whose surface energy changes has a low optical sensitivity, the method takes an amount of UV irradiation greater than 20 J/cm².

Patent Document 1: Japanese Laid-Open Patent Application No. 2005-310962

Non-Patent Document 1: Proceedings of the 52nd Spring Meeting of The Japan Society of Applied Physics and Related Societies, p. 1510, 31p-YY-5

SUMMARY DISCLOSURE OF THE INVENTION

In an aspect of this disclosure, there is provided a laminate structure capable of changing the surface free energy with a small amount of UV irradiation, and a method of manufacturing the laminate structure. In an aspect, there is provided an electronic device having the laminate structure, an electronic device array having a plurality of the electronic devices, and a display apparatus having the electronic device array.

In another aspect of this disclosure, there is provided a laminate structure comprising a substrate on which a wettability variable layer and a conducting layer are disposed, the wettability variable layer containing a material whose critical surface tension changes upon application of energy, and the conducting layer being patterned on the wettability variable layer. The material with variable critical surface tension includes a main chain and a side chain. The side chain has two or more sites of which the bond is cleaved upon absorption of the energy. Thus, a laminate structure can be provided of which surface free energy can be changed with a small amount of UV irradiation.

In an embodiment, each of the two or more sites of which the bond is cleaved has, independently, a functional group expressed by the structural formula:

Thus, the surface free energy can be changed with a small amount of UV irradiation.

In another embodiment, at least one of the two or more sites of which the bond is cleaved is linked with a conjugate structure. Thus, the surface free energy can be changed with a small amount of UV irradiation.

In another embodiment, the side chain has a hydrophobic group. Thus, the surface free energy can be changed with a small amount of UV irradiation.

In another embodiment, the side chain has a multi-branching structure. Thus, the surface free energy can be changed with a small amount of UV irradiation.

In yet another embodiment, the main chain comprises polyimide. Thus, insulating property can be maintained even after UV light irradiation.

In yet another embodiment, the polyimide comprises a soluble polyimide. Thus, polyimide can be coated and formed as a film by a print method.

In yet another embodiment, the wettability variable layer has an insulating property. Thus, the wettability variable layer can provide the function of an insulating film.

In yet another embodiment, the laminate structure further comprises a semiconductor layer. Thus, an electronic device such as a thin-film transistor having good characteristics can be obtained.

In yet another embodiment, the semiconductor layer comprises an organic semiconductor material. Thus, a process of manufacturing an electronic device such as an organic thin-film transistor can be simplified and cost reduction can be achieved.

In yet another embodiment, the laminate structure further comprises an insulating layer having a higher insulating property than the wettability variable layer, the wettability variable layer being formed on the insulating layer. Thus, insulating property can be maintained even after UV light irradiation.

In yet another embodiment, the laminate structure comprises plural of the wettability variable layers and plural of the conducting layers patterned on the wettability variable layers. Thus, all electrodes of an electronic device such as a thin-film transistor can be formed very finely and highly densely.

In another aspect, there is provided an electronic device comprising any of the laminate structures. Thus, an electronic device can be provided in which a very fine and high-density electrode pattern can be formed with a small amount of UV irradiation.

In a further aspect, there is provided an electronic device array comprising the electronic device. Thus, an electronic device array that comprises high-performance thin-film transistors and of which manufacturing process is simplified can be provided.

In yet another aspect, there is provided a display apparatus comprising the electronic device array. Thus, by combining an active matrix substrate comprising organic thin-film transistors with pixel display elements, a display apparatus that is inexpensive and flexible can be provided.

In a further aspect, there is provided a laminate structure manufacturing method comprising a first step of forming a wettability variable layer on a substrate; a second step of forming a high surface energy portion and a low surface energy portion by supplying energy to a predetermined region of the wettability variable layer formed on the substrate, thus changing the critical surface tension of the wettability variable layer; and a third step of forming a conducting layer on the high surface energy portion by providing the high surface energy portion with a liquid containing an electrically conductive material. The wettability variable layer includes a material having a main chain and a side chain, the side chain having two or more sites of which the bond is cleaved upon absorption of the energy. Thus, a laminate structure manufacturing method capable of manufacturing a laminate structure having a fine electrode pattern can be provided, the method involving a low-cost and high material-utilization-ratio process, such as a printing method.

In an embodiment, the energy is supplied by UV irradiation. Thus, a laminate structure having a very fine and high-density electrode pattern can be provided.

In another embodiment, the energy is supplied by heating. Thus, a laminate structure having a fine electrode pattern can be manufactured without affecting the inside thereof.

In yet another embodiment, the high surface energy portion is supplied with the liquid containing an electrically conductive material by an ink jet method. Thus, more advantage can be taken of the surface energy of the wettability variable layer by supplying a smaller amount of droplets.

In another embodiment, the method comprises plural of the first steps, the second steps and the third steps. Thus, an electronic device such as a field-effect transistor having a fine electrode pattern can be manufactured by a print method, which is low-cost and has a high material-utilization efficiency.

Thus, a laminate structure of which the surface free energy can be changed with a small amount of UV irradiation can be provided. The disclosure also provides a method of manufacturing such a laminate structure; an electronic device having such a laminate structure; an electronic device array having plural of the electronic devices; and a display apparatus having the electronic device array.

BRIEF DESCRIPTION OF THE DRAWINGS

The aforementioned and other aspects, features and advantages will be apparent to those skilled in the art from the following detailed description, when read in conjunction with the accompanying drawings, in which.

BEST MODE FOR CARRYING OUT THE INVENTION

In the following, preferred embodiments of the present invention are described with reference to the drawings.

Figure 1:
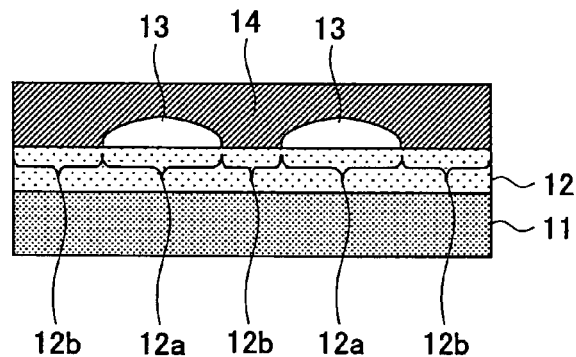
FIG. 1 shows a cross-sectional view of an example of a laminate structure of the present invention.

FIG. 1 shows an example of a laminate structure according to the present invention. The laminate structure shown in FIG. 1 includes a substrate 11 on which a wettability variable layer 12 is formed as a base. The wettability variable layer 12 contains a material whose critical surface tension changes upon application of energy such as heat, UV light, electron beam, or plasma. In the wettability variable layer 12, at least two regions having different critical surface tensions are formed; i.e., a high surface energy portion 12a having a large critical surface tension; and a low surface energy portion 12b having a small critical surface tension. Between two of the high surface energy portions 12a, a gap of 1 to 5 μm, for example, is formed. On the high surface energy portions 12a, conducting layers 13 are formed. A semiconductor layer 14 is disposed such that it is at least in contact with the low surface energy portions 12b.

In the present invention, the material whose critical surface tension varies has a main chain and a side chain. The side chain has two or more sites of which the bond is cleaved upon absorption of energy. Preferably, the sites where such bond cleavage occurs has a functional group having a structural formula expressed by:

Generally, a material with variable critical surface tension can be caused to have its surface free energy changed by irradiation of high-energy light, such as UV light. Since the material used in the present invention has a high optical sensitivity, its critical surface tension can be varied even with a reduced amount of UV light irradiation.

In the following, the mechanism of the change in surface free energy by UV irradiation is described. When a material with variable critical surface tension has a carbonyl group in a side chain, bond cleavage occurs between the carbonyl group in the side chain and an adjacent functional group upon irradiation of UV light with a wavelength of 300 on or smaller, thereby producing a radical (•C=O). Such a radical has high reactivity and therefore immediately reacts with the moisture contained in the atmosphere, producing a hydrophilic group, such as a carboxyl group. As a result, the variable critical surface tension material is rendered hydrophilic.

By utilizing such a mechanism, molecular design can be performed as follows. For example, an ester bond is introduced in a side chain having a hydrophobic group such as a hydrocarbon group or a fluorocarbon group, preferably in the vicinity of a main chain. Namely, in the side chain, a hydrophobic group is introduced in the vicinity of the main chain, via an ester bond. A film formed of such a material exhibits hydrophobicity prior to UV light irradiation. Upon UV light irradiation, an ester bond cleavage occurs, whereby the hydrophobic group becomes dissociated and the surface is rendered hydrophilic by the carboxyl group produced. Ideally, one ester bond is cleaved by a single photon. In an actual system, however, since quantum yield is low, each side chain preferably has two or more ester bonds. The ester bonds are preferably linked with a hydrophobic group via a conjugate structure, such as a benzene ring or a naphthalene ring. In this way, the carbonyl group of ester bond and the conjugate structure can conjugate with each other, so that the ester bond can be cleaved with low-energy UV light.

Preferably, the side chain has two or more hydrophobic groups per ester bond, i.e., a multi-branching structure. In this way, it becomes possible to produce a large change in surface free energy even with a small amount of UV light irradiation energy. The multi-branching structure may be either a dendrimer or a hyperbranch; however, a dendrimer is preferable. A dendrimer has a structure in which a central molecule branches off with good symmetry. On the other hand, a hyperbranch has a randomly branching structure having various degrees of branching and polymerization, which is obtained by polymerizing AB2 monomers. The dendrimer and the hyperbranch are defined in "Dendritic Polymer" (published by NTS Inc.), for example.

In the present invention, preferably the side chain having a multi-branching structure has a general formula expressed by

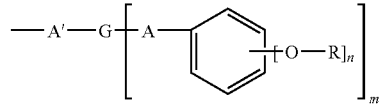

where A and A' are, independently from each other, a single bond, —COO—, —OCO—, —NHCO—, —NHCOO—, or —NHOCO—; m is 1 to 3; n is 2 or 3; G is a phenylene group or a naphthalene group when m=1, a trivalent benzene ring when m=2, or a tetravalent benzene ring when m=3; and R is a straight-chain, branching or cyclic alkyl or fluoroalkyl group with a carbon number of 1 to 15.

In accordance with the present invention, the material with a variable critical surface tension can maintain its insulating property even upon UV light irradiation. Generally, the insulating property of a material with variable critical surface tension decreases upon UV irradiation because the UV irradiation severs not just the side chain but also the main chain. In order to prevent this, a skeleton that absorbs no UV light (skeleton of σ bond, such as a skeleton obtained by polymerizing a vinyl group, or a skeleton having a siloxane bond) could be introduced into the main chain. However, it is known that, due to the characteristics of polyvinyl, polyvinylphenol, or polysiloxane, polymers having such a skeleton have a low insulating property. This is due to the fact that such polymers do not have a rigid structure, so that they have a poor packing property and are unable to have a dense structure. Therefore, insulating property cannot be maintained merely by introducing a skeleton that absorbs no UV light into the main chain. Another possible solution might be to increase the chain length of the main chain of the material with variable critical surface tension so that, even when the main chain is severed by UV light, a sufficient chain length can be ensured for maintaining insulating property. However, increasing the chain length of a main chain leads to a decrease in solubility with respect to solvent. As a result, the film forming property decreases.

Furthermore, while a material with a large UV light absorption coefficient could be added to the wettability variable layer, there is no organic material with a large absorption coefficient, making it necessary to make the film thickness extremely large or use an inorganic material (such as $TiO_2$) having a large absorption coefficient. If an inorganic material is used, since a wettability variable layer cannot be formed with the inorganic material alone, the inorganic material needs to be dispersed in a material with variable critical surface tension. However, it is difficult to make the particle size of the inorganic material, such as $TiO_2$, smaller than about 1 µm. As a result, in order to add the inorganic material in the wettability variable layer to such an extent that the material can be sufficiently dispersed in the layer, the film thickness needs to be on the order of several µm.

In accordance with the present invention, in order to make the material with variable critical surface tension maintain its rigid structure when severed by UV light to some extent, preferably polyimide, with its good packing property, is introduced into the main chain. Examples of polyimide include a thermosetting polyimide, which is produced by a dehydrating condensation reaction caused by heating polyamic acid, and soluble polyimide that is soluble in a solvent. A soluble polyimide film can be obtained by applying a coat of an application liquid dissolved in a solvent and then allowing the solvent to evaporate at a low temperature of less than 200° C. On the other hand thermosetting polyimide generally needs to be heated to temperatures of 200° C. or above in order to cause a dehydrating condensation reaction. Thus, soluble polyimide is preferable from the viewpoint of its high insulating property and its allowing the formation of a film having solvent resistance at low temperature.

Soluble polyimide is obtained by subjecting polyamic acid, which is a reaction product of dianhydride and diamine, to a chemical imidization process in a solution in advance. Polyimide, when it has a rigid structure, is hard to dissolve in a solvent. Thus, in order to disturb the polyimide's crystallinity and make it more yielding to solvation, bulky alicyclic cyclocarboxylic dianhydride is preferably used as a dianhydride.

By using what dianhydride the polyimide has been synthesized can be inferred by analyzing the oscillation of a characteristic group based on the infrared absorption spectrum of the polyimide thin-film, or by analyzing the UV-visible absorption spectrum. A polyimide thin-film having a bulky alicyclic cyclocarboxylic dianhydride skeleton has an edge absorption wavelength of 300 nm or smaller. For more details, reference can be made to "Latest Polyimides—Fundamentals and Applications," published by NTS Inc., or "Electronics for the Next Generation: Development of Novel Polyimides for Electronic Materials and High-Function Providing Technologies," published by Technical Information Institute Co., Ltd.

Since soluble polyimide does not contain any remaining unreacted polyamic acid or by-product dianhydride, problems of defective polyimide electric characteristics due to such impurities are unlikely to occur.

Soluble polyimide is soluble in a strongly polar solvent, such as γ-butyrolactone, N-methylpyrrolidone, or N,N-dimethylacetamide. Therefore, by using a low polar solvent, such as toluene, xylene, acetone, or isopropyl alcohol when forming a semiconductor layer over the wettability variable layer, erosion of the wettability variable layer by the solvent can be prevented.

In accordance with the present invention, the wettability variable layer may consist of ether a single material or two or more kinds of material. When the wettability variable layer consists of two or more kinds of material, an insulating material and a material with variable critical surface tension are preferably mixed. Thereby, it becomes possible to form a wettability variable layer having a high insulating property and wider variations in the surface free energy. Examples of the insulating material include polyimides, polyamide-imides, epoxy resins, silsesquioxanes, polyvinylphenols, polycarbonates, fluorine-based resins, and polyparaxylylenes. Polyvinylphenol or polyvinyl alcohol may be cross-linked. Preferably the material with variable critical surface tension has a hydrophobic group in a side chain; an example is a material comprising a main chain having a skeleton obtained by polymerization of polyimide, polyamide-imide, and (meta)acrylic acid, to which main chain a side chain having a hydrophobic group is bonded either directly or via a linking group. Examples of the hydrophobic group include functional groups having a terminal structure of —$CF_2CH_3$, —$CF_2CF_3$, —$CF(CF_3)_2$, or —$CFH_2$. Polyimides with a side chain having an alkyl group are described in the aforementioned publication "Electronics for the Next Generation: Development of Novel Polyimides for Electronic Materials and High-Function Providing Technologies," published by Technical Information Institute Co., Ltd.

By constructing the wettability variable layer from two or more kinds of materials, it becomes possible to use materials that provide large changes in surface free energy but that are problematic in film forming property, as the material with variable critical surface tension. Specifically, it becomes possible to easily form a wettability variable layer by mixing a material that has large variations in surface free energy but that is difficult to be formed into a film due to its strong cohesion, with a material having a good film forming property.

When forming the wettability variable layer with two or more kinds of materials containing a material with variable critical surface tension having the main chain consisting of a soluble polyimide, the material other than the material with variable critical surface tension is preferably also a soluble material. Thereby, it becomes possible to form a film at low temperature. Furthermore, the material other than the material with variable critical surface tension is preferably a material having good compatibility with the soluble polyimide. Thereby, the development of phase separation in the presence of a solvent can be suppressed. Such a soluble material may comprise organic matter or a compound of organic matter and inorganic matter; Examples include phenol resins such as polyvinylphenol, melamine resins, polysaccharides such as acetylated pullulan, and silsesquioxanes. The soluble material also preferably comprises a soluble polyimide from the viewpoint of heat resistance, solvent resistance, and compatibility.

In accordance with the present invention, preferably the wettability variable layer comprises a material whose surface free energy changes upon application of energy, such as heat, UV light, electron beam, or plasma, and that has large variations in surface free energy before and after the injection of such energy. In this case, by imparting such energy to a part of the wettability variable layer, it becomes possible to form a pattern of high surface energy portions and low surface energy portions that have different critical surface tensions. In this case, a liquid that contains an electrically conductive material easily becomes attached to the high surface energy portions (lyotropic), while it does not become easily attached to the low surface energy portions (lyophobic). As a result, the liquid containing conductive material becomes selectively attached to the high surface energy portions in accordance with the pattern, so that a conducting layer can be formed by solidifying the high surface energy portions.

In accordance with the present invention, the wettability variable layer preferably has a thickness in the range of from 30 nm to 3 μm and more preferably in the range of from 50 nm to 1 μm. If the thickness is smaller than 30 nm, the layer's characteristics as a bulk body (such as insulating property, gas barrier property, and damp proof property) may be adversely affected, while a thickness of smaller than 3 μm may adversely affect the surface shape.

The conducting layer is formed by applying a coat of a liquid containing an electrically conductive material and then solidifying it by heating or UV irradiation, for example. Examples of the liquid containing a conductive material include a solution in which a conductive material is dissolved in a solvent; a solution in which a conductive material precursor is dissolved in a solvent; a dispersion liquid in which a conductive material is dispersed in a solvent; and a dispersion liquid in which a conductive material precursor is dispersed in a solvent. Specific examples include a dispersion liquid in which metal fine particles of Ag, Au, or Ni are dispersed in an organic solvent or water; and an aqueous solution of a conducting polymer such as doped PANI (polyaniline) or PEDOT (polyethylene dioxithiophene) doped with PSS (polystyrene sulfonic acid).

Methods of coating the surface of the wettability variable layer with a liquid containing a conductive material include spin-coating, dip-coating, screen printing, offset printing, and an ink jet method. Of these methods, the ink jet method, which is capable of supplying smaller droplets, is preferable so as to take advantage of the surface energy of the wettability variable layer more readily. When a conventional head typically used in a printer is used, resolution of the ink jet method may be 30 μm and the positioning accuracy is on the order of ±15 μm. By taking advantage of the difference in surface energy of the wettability variable layer, finer patterns can be formed.

In the laminate structure of the present invention, an insulating layer having a higher insulating property than that of the wettability variable layer may be provided between the substrate and the wettability variable layer. By a "high insulating property" herein it is meant that such an insulating layer has a large volume resistance. When the wettability variable layer has an insulating property, the wettability variable layer can provide the function of an insulating layer. In this case, the aforementioned insulating layer may not be formed. It is also possible to form the insulating layer and the wettability variable layer by applying a coat of an application liquid consisting of a solution in which an insulating material used for the insulating layer and a material with variable critical surface tension used for the wettability variable layer are mixed and then forming it in the form of a film.

When the wettability variable layer is formed on the insulating layer, the wettability variable layer preferably comprises a material having a greater absorption coefficient than the insulating material used in the insulating layer, in order to prevent the insulating layer from being affected by UV irradiation.

Examples of the insulating material used in the insulating layer include polyimides, polyamide-imides, epoxy resins, silsesquioxanes, polyvinylphenols, polycarbonates, fluorine-based resins, and polyparaxylylenes.

Examples of the material of the semiconductor layer include inorganic semiconductors such as CdSe, CdTe, and Si. Other examples are organic semiconductors, such as organic low molecules such as pentacene, anthracene, tetracene, and phthalocyanine; polyacetylene-based conducting polymers; polyphenylene-based conducting polymers such as polyparaphenylene and derivatives thereof, and polyphenylene vinylene and derivatives thereof; heterocyclic conducting polymers such as polypyrrole and derivatives thereof, polythiophene and derivatives thereof, and polyflan and derivatives thereof; and ionic conducting polymers such as polyaniline and derivatives thereof. Among those, organic semiconductors are preferable as they exhibit a more pronounced effect of characteristics improvement by the wettability variable layer.

The laminate structure in accordance with the present invention, which may further comprise additional wettability variable layers or conducting layers, can be used in the form of an electronic device, such as a transistor.

EXAMPLES

The Examples described below are for illustrative purpose only and the present invention is not limited by any of the Examples. In the following Examples, polyimides A, B, C, and D were used as soluble polyimides. Specifically, polyimide A is expressed by the structural formula:

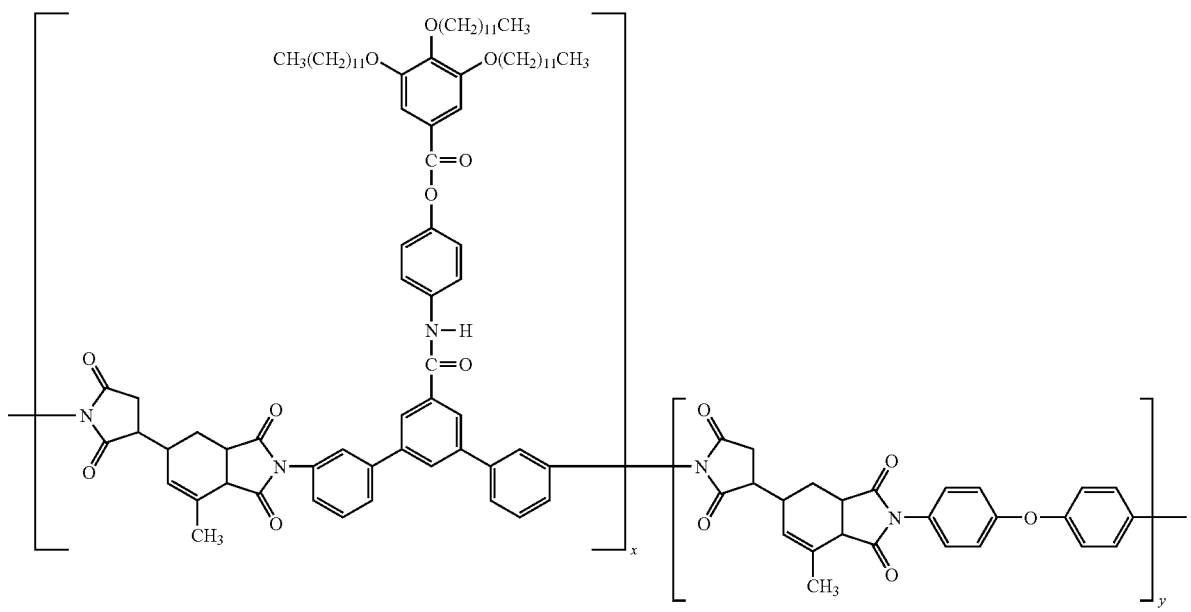

where the molar ratio x:y was 1:9, and the side chain had a dendrimer structure and two carbonyl groups.

Polyimide B is expressed by the structural formula:

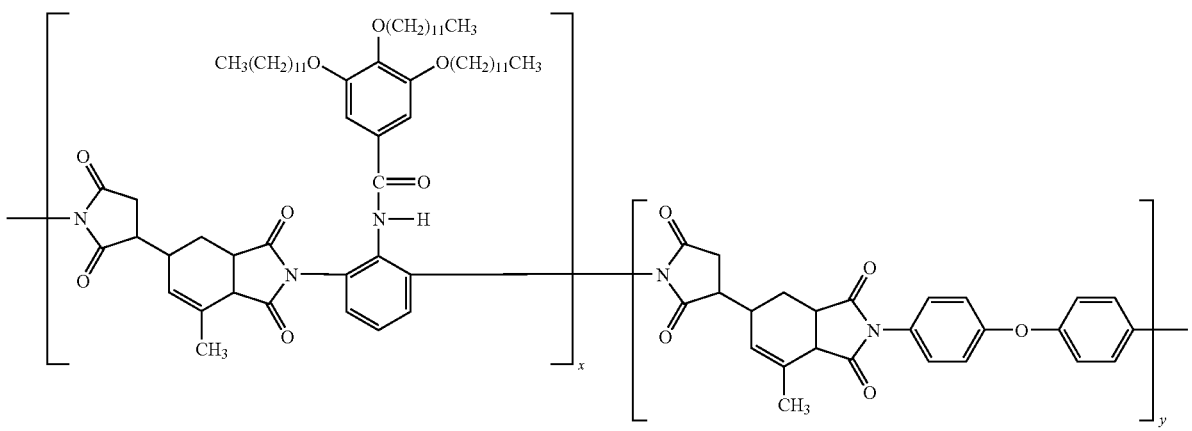

(35)

where the molar ratio x:y was 1:9, and the side chain had a dendrimer structure and one carbonyl group.

Polyimide C is expressed by the structural formula:

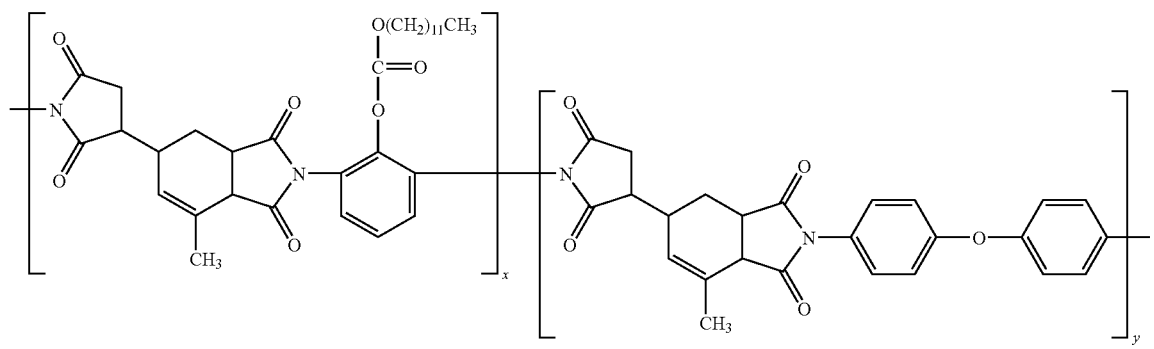

(65)

where the molar ratio x:y was 1:9, and the side chain had no dendrimer structure and had one carbonyl group.

Polyimide D is expressed by the structural formula:

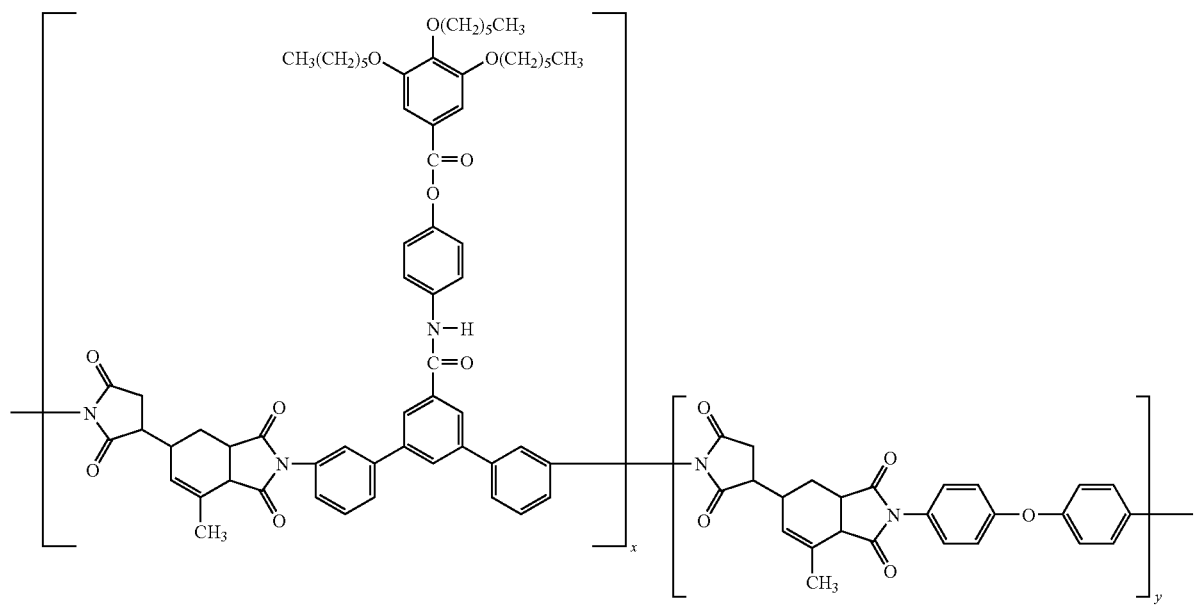

where the molar ratio x:y was 1:9, and the side chain had a dendrimer structure, two carbonyl groups, and an n-hexyl group.

Reference Example 1

A glass substrate was spin-coated with 5 wt % NMP (N-methyl-2-pyrrolidone) solutions of polyimides A to D. After prebaking in an oven at 100° C., the solvent was removed at 180° C., thereby forming a wettability variable layer. The film thickness of the resultant wettability variable layer, as determined by the stylus method, was 100 nm in all of the cases. Each wettability variable layer was then irradiated with UV light (from an extra high pressure mercury lamp) with a wavelength of 300 nm or smaller. The contact angle of water and a dispersion liquid (to be hereafter referred to as a silver nano-ink), in which silver nanoparticles were dissolved in a water-based solvent, with respect to irradiation time was determined by the drop method. In the measurement of the contact angle, similar tendencies were observed in the change in contact angle with respect to the amount of UV irradiation for both water and the silver nano-ink.

Figure 2:
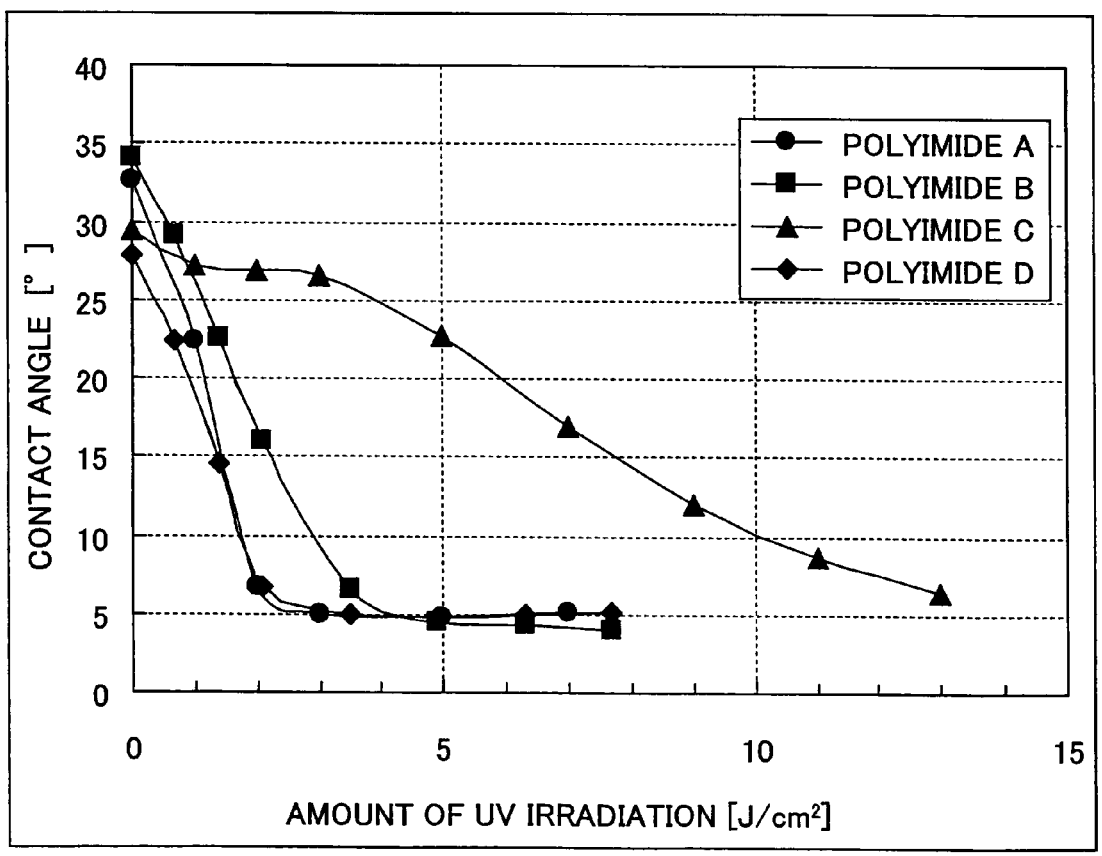
FIG. 2 shows how the contact angle changes with respect to the amount of UV irradiation in Reference Example 1.

The result for the silver nano-ink is shown in FIG. 2. It can be seen that in all of polyimides A, B, and D having the dendrimer structure and in polyimide C having no dendrimer structure, the contact angle, i.e., the surface free energy of the polyimide film, varied upon UV irradiation. However, the amount of UV irradiation that was required for achieving the same contact angle was the smallest for polyimide A, in which the side chain had two photoresponsive sites (carbonyl groups) and a phenyl skeleton between the photoresponsive sites; specifically, the amount was approximately one half with respect to polyimide B and one fifth with respect to polyimide C. Thus, by introducing plural photoresponsive sites into the side chain, a surface having a small contact angle, i.e., a high surface free energy, can be obtained with a small amount of UV irradiation. It was also learned that by introducing a dendrimer structure in the side chain, the contact angle increases, i.e., the surface free energy decreases, in the absence of UV light irradiation, so that large changes in surface free energy can be obtained.

When polyimide A and polyimide D having different lengths of the hydrocarbon chain of the side chain were compared, it was seen that the length of the hydrocarbon chain affects the initial contact angle prior to UV light irradiation; namely, in the case of polyimide D, the value was approximately 80% of the corresponding value for polyimide A. When the hydrocarbon chain was made shorter than in the case of polyimide D, the initial contact angle sharply decreased, whereby the changes in contact angle, or surface free energy, due to UV irradiation decreased so much that a sufficient contrast for patterning was not obtained. Thus, the hydrocarbon chain should desirably have a carbon number of 6 or greater.

Example 1, Comparative Examples 1 and 2

By a vacuum deposition method with the use of a metal mask, a gate electrode of aluminum with a film thickness of 50 nm was formed on a glass substrate. The substrate was further spin-coated with the polyimide RIKACOAT SN-20 (New Japan Chemical Co., Ltd.) and then baked at 200° C., thereby forming an insulating layer with a film thickness of 500 nm. Over the insulating layer, a wettability variable layer consisting of polyimide A (Example 1), polyimide B (Comparative Example 1), or polyimide C (Comparative Example 2) was formed to a thickness of 100 nm, as in Reference Example 1. Then, UV light (from an extra high pressure mercury lamp) having a wavelength of 300 nm or smaller was irradiated via a photomask having a lined pattern with 5 μm intervals, with an amount of irradiation of 1 to 15 $J/cm^2$, thereby forming high surface energy portions on the wettability variable layer. After ultrasonic cleaning in an aqueous solution of neutral detergent, and washing with ultrapure water, drying was performed in an oven at 120° C. Thereafter, a silver nano-ink was discharged onto the high surface energy portions by the ink jet method, followed by baking in an oven at 200° C., thereby forming electrode lines. The patterning property of the electrode lines at 5 μm intervals was evaluated using a metallurgical microscope.

The evaluation results are shown in Table 1, where "Excellent" indicates a 100% formation of an electrode line, "Good" indicates approximately 95% formation, "Poor" indicates partial formation, and "Bad" indicates hardly any formation.

TABLE 1

| | Amount of UV irradiation ($J/cm^2$) | | | | |
|---|---|---|---|---|---|
| | 1 | 2 | 5 | 10 | 15 |
| Ex. 1 | Bad | Good | Excellent | Excellent | Excellent |
| Comp. Ex. 1 | Bad | Bad | Excellent | Excellent | Excellent |
| Comp. Ex. 2 | Bad | Bad | Bad | Poor | Excellent |

The above result corresponds well with the relationship between the amount of UV irradiation and contact angle obtained with regard to Reference Example 1. Namely, in Example 1, a high surface energy portion was formed with UV irradiation of 2 $J/cm^2$, wherein, since the surface free energy was low (i.e., the contact angle is large) at the portion that had not been irradiated with UV light, the boundary was clearly delineated, making it possible to form the electrode lines of 5 μm intervals. In Comparative Example 1, while the electrode lines at 5 μm intervals could be formed with a smaller amount of UV irradiation than in Comparative Example 2, hardly any electrode lines at 5 μm intervals were formed with the 2 $J/cm^2$ UV irradiation in Comparative Example 2, in which no high surface energy portion was formed until UV light irradiation on the order of 10 $J/cm^2$ was supplied. Furthermore, since the contact angle at the portion that had not been irradiated with UV light was not large compared with polyimide A, sufficient contrast was not obtained even with the amount of UV irradiation of 10 $J/cm^2$, resulting in a lack of formation of the electrode lines at 5 μm intervals in some portions.

Thus, with polyimide A having two photo-functional sites in the side chain, the electrode lines at 5 μm intervals were formed with a smaller amount of UV irradiation than in the case of either polyimide B or C having one photoresponsive site in the side chain.

Example 2, Comparative Examples 3 and 4

The electrode line patterning property was evaluated in the same way as in Example 1 and Comparative Examples 1 and 2 with the exception that irradiation took place via a photomask having a lined pattern at 1 to 20 μm intervals, using UV light (from an extra high pressure mercury lamp) with a wavelength of 300 nm or smaller and an irradiation amount of 3 $J/cm^2$.

The evaluation result is shown in Table 2.

TABLE 2

| | Electrode line intervals (μm) | | | | | |
|---|---|---|---|---|---|---|
| | 1 | 2 | 3 | 5 | 10 | 20 |
| Ex. 2 | Bad | Poor | Good | Excellent | Excellent | Excellent |
| Comp. Ex. 3 | Bad | Bad | Poor | Poor | Good | Excellent |
| Comp. Ex. 4 | Bad | Bad | Bad | Bad | Bad | Bad |

The above result corresponds well with the relationship between the amount of UV irradiation and contact angle obtained with regard to Reference Example 1. Namely, in Example 2, it was possible to form electrode lines at 3 μm intervals. In Comparative Example 3, while the electrode lines could be formed at narrower intervals than in Comparative Example 4, the electrode lines could not be formed at such narrow intervals as in Example 2. In Comparative Example 4, the electrode lines could not be formed at intervals of 20 μm or smaller.

Thus, with polyimide A having two photo-functional sites in the side chain, the electrode lines were formed at narrower intervals than in the case of either polyimide B or C having one photoresponsive site at the side chain.

Example 3, Comparative Examples 5 and 6

Figure 3:
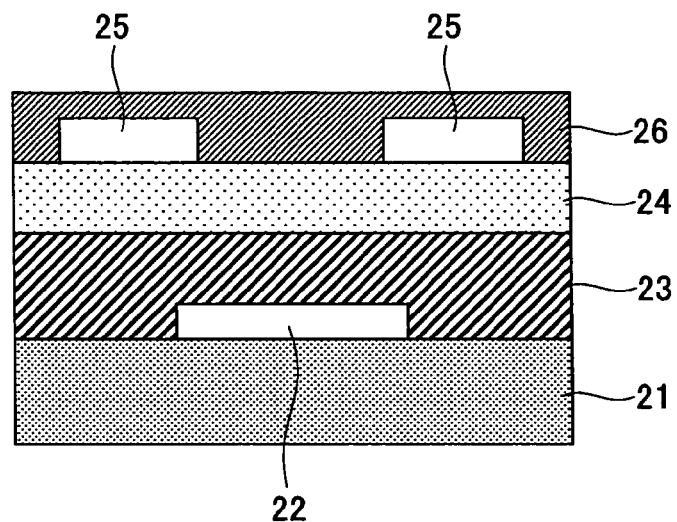
FIG. 3 shows an organic transistor according to Example 3.

On a glass substrate 21, a gate electrode 22 was formed of aluminum to a thickness of 50 nm by vacuum deposition involving a metal mask. On top of this, an insulating layer 23 of parylene was formed by vapor deposition. A wettability variable layer 24 was further formed thereon of polyimide A (Example 3) or polyimide C (Comparative Examples 5 and 6), to a thickness of 100 nm. Furthermore, irradiation of UV light (from an extra high pressure mercury lamp) with a wavelength of 300 nm or smaller was conducted via a photomask having a lined pattern at 5 μm intervals, such that the irradiation amount was 3 $J/cm^2$ (Example 3 and Comparative Example 5) or 15 $J/cm^2$ (Comparative Example 6), thereby forming a high surface energy portion on the wettability variable layer 24. The irradiation amount for Comparative Example 6 was such that the electrode lines could be formed (see Comparative Example 2). Then, a silver nano-ink was discharged onto the high surface energy portion by the ink jet method, followed by baking at 200° C., whereby source and drain electrodes 25 with a thickness 50 nm were formed. Thereafter, an application liquid in which triarylamine (organic semiconductor material) expressed by the following structural formula:

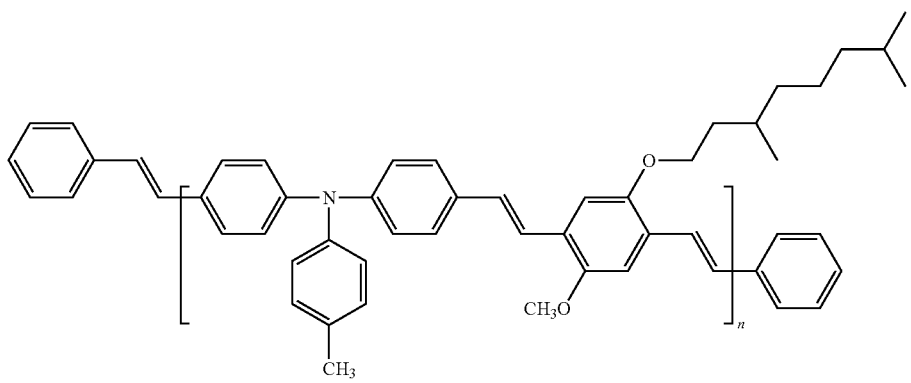

was dissolved in a xylene/mesitylene mixture solvent was added dropwise to the channel length portion by the ink jet method. This was followed by drying at 120° C., thereby forming an organic semiconductor layer 26 with a film thickness of 30 nm and fabricating an organic transistor (see FIG. 3). In this case, the insulating layer 23 and the wettability variable layer 24 function as gate insulating films.

The evaluation result of the transistor characteristics is shown in Table 3.

TABLE 3

|  | Ex. 3 | Comp. Ex. 5 | Comp. Ex. 6 |
| --- | --- | --- | --- |
| On/off ratio | 5 digits | x | 3 digits |
| Field-effect mobility (cm$^2$/V · sec) | $5 \times 10^{-3}$ | x | $4 \times 10^{-4}$ |

From Table 3, it is seen that in Example 3, the source and drain electrodes had good patterning property, whereby an organic transistor having a field-effect mobility of $5 \times 10^{-3}$ cm$^2$/V·sec was obtained. This value was comparable to the corresponding value of an organic transistor fabricated with source and drain electrodes that were made of gold by vacuum deposition via a metal mask.

In Comparative Example 5, since the amount of change in contact angle (surface free energy) was not sufficient, it was unable to form the source and drain electrodes. On the other hand, in Comparative Example 6, the source and drain electrodes were formed; however, the field-effect mobility of the organic transistor was on the order of $10^{-4}$ cm$^2$/V·sec. Furthermore, the off-current was large and the on/off ratio was in three digits, which was approximately two orders of magnitude smaller than Example 3. A detailed analysis showed that the gate leak was increased in the organic transistor of Comparative Example 6 over the organic transistor of Example 3. This result is inferred to be due to the difference in the amount of UV irradiation. Namely, in Comparative Example 6, UV light irradiation had to be conducted for a long time in order to form the source and drain electrodes, whereby the parylene in the insulating layer was influenced, resulting in a decrease in insulating property. This is believed to have resulted in the increase in gate leak, leading to the decrease in the on/off ratio.

Thus, with polyimide A, which had two photo-functional sites in the side chain and a dendrimer structure, a transistor having excellent characteristics was obtained using a smaller amount of UV irradiation than with polyimide C, which had one photoresponsive site and which did not have a dendrimer structure.

Example 4, Comparative Example 7

Figure 4:
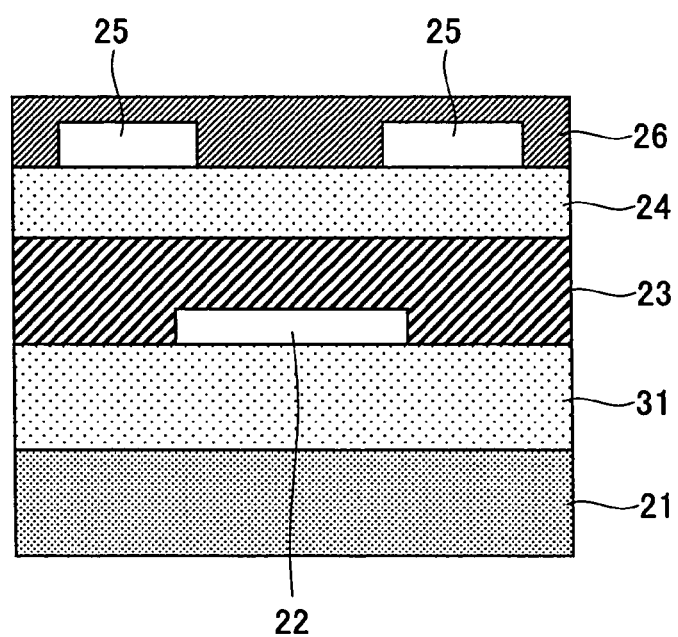
FIG. 4 shows an organic transistor according to Example 4 or 5.

A film substrate 21 was spin-coated with an NMP solution of polyimide A and then baked at 180° C., thereby forming a wettability variable layer 31 with a thickness of 50 nm. Then, via a photomask, irradiation of UV light (from an extra high pressure mercury lamp) with a wavelength of 300 nm or smaller was conducted with an irradiation amount of 3 J/cm$^2$, thereby forming a high surface energy portion on the wettability variable layer 31. Thereafter, a silver nano-ink was discharged onto the high surface energy portion by the ink jet method followed by baking at 180° C., whereby a gate electrode 22 with a thickness of 50 nm was formed. The gate electrode 22 was further spin-coated with a polyimide solution PI213B (by Maruzen Petrochemical Co. Ltd.) followed by baking at 180° C., whereby an insulating layer 23 with a thickness 500 nm was formed. Thereafter, on the insulating layer 23, a wettability variable layer 24 of polyimide A (Example 4) or polyimide C (Comparative Example 7) was formed in the same manner as described above, to a thickness of 100 nm. Furthermore, via a photomask having a lined pattern at 5 μm intervals, irradiation of UV light (from an extra high pressure mercury lamp) with a wavelength of 300 nm or smaller was conducted with the irradiation amount of 3 J/cm$^2$ (Example 4) or 15 J/cm$^2$ (Comparative Example 7), thereby forming a high surface energy portion on the wettability variable layer 24. Then, a silver nano-ink was discharged onto the high surface energy portion by the ink jet method. This was followed by baking at 180° C., whereby source and drain electrodes 25 were formed to a thickness of 50 nm. Furthermore, as in Example 3, an organic semiconductor layer 26 was formed, thereby fabricating an organic transistor (see FIG. 4). In this case, the insulating layer 23 and the wettability variable layer 24 function as gate insulating films.

The evaluation result of transistor characteristics is shown in Table 4.

TABLE 4

|  | Ex. 4 | Comp. Ex. 7 |
| --- | --- | --- |
| On/off ratio | 5 digits | 2 digits |
| Field-effect mobility (cm$^2$/V · sec) | $3 \times 10^{-3}$ | $1 \times 10^{-4}$ |

It is seen from Table 4 that in Example 4, a good source and drain electrodes patterning property was obtained, whereby an organic transistor having a field-effect mobility of $3\times10^{-3}$ cm²/V·sec was obtained. This value is comparable to the corresponding value of the organic transistor according to Example 3.

In Comparative Example 7, the field-effect mobility was on the order of $10^{-5}$ cm²/V·sec. In addition, the off-current was large and the on/off ratio was in two digits, which was approximately three orders of magnitude smaller than Example 4. A detailed analysis showed that the gate leak was increased in the organic transistor of Comparative Example 7 over the organic transistor of Example 4. This result is inferred to be due to the difference in the amount of UV irradiation. Namely, irradiation of UV light had to be conducted for a long time in Comparative Example 7 in order to form the source and drain electrodes, resulting in the polyimide in the insulating layer being influenced and leading to a decrease in insulating property. Consequently, it is believed, the gate leak increased and the on/off ratio decreased as a result.

Thus, with polyimide A, which had two photo-functional sites in the side chain and a dendrimer structure, a transistor having excellent characteristics was obtained with a smaller amount of UV irradiation than with polyimide C, which had one photoresponsive site and no dendrimer structure.

Example 5

A glass substrate 21 was spin-coated with an NMP solution of polyimide A and than baked at 200° C., thereby forming a wettability variable layer 31 with a film thickness of 50 nm. Then, via a photomask, irradiation of UV light (from an extra high pressure mercury lamp) with a wavelength of 300 nm or smaller was conducted with an irradiation amount of 3 J/cm², whereby a high surface energy portion was formed on the wettability variable layer 31. Using the ink jet method, a silver nano-ink was discharged onto the high surface energy portion, followed by baking at 200° C., thereby forming a gate electrode 22 with a film thickness of 50 nm. On top of this, a polyvinylphenol solution (from Sigma-Aldrich) was spin-coated, followed by baking at 200° C., thereby forming an insulating layer 23 with a film thickness of 500 nm. Thereafter, a wettability variable layer 24 of polyimide A with a thickness of 100 nm was formed on the insulating layer 23 in the same way as described above. Then, irradiation of UV light (from an extra high pressure mercury lamp) with a wavelength of 300 nm or smaller was conducted via a photomask having a lined pattern of 5 μm intervals with an irradiation amount of 1 J/cm², while warming with a hot plate at 70° C., thereby forming a high surface energy portion on the wettability variable layer 24. A silver nano-ink was then discharged onto the high surface energy portion by the ink jet method, followed by baking at 200° C., thereby forming source and drain electrodes 25 with a thickness of 50 nm. An organic semiconductor layer 26 was further formed as in Example 3, whereby an organic transistor was fabricated (see FIG. 4). In this case, the insulating layer 23 and the wettability variable layer 24 function as gate insulating films.

The evaluation result of the transistor characteristics is shown in Table 5.

TABLE 5

|  | Ex. 5 |
|---|---|
| On/off ratio | 5 digits |
| Field-effect mobility (cm²/V · sec) | $4 \times 10^{-3}$ |

It can be seen from Table 5 that in Example 5, the source and drain electrodes had good patterning property, and that the organic transistor had a field-effect mobility of $4\times10^{-3}$ cm²/V·sec. This value is comparable to the corresponding value of the organic transistor according to Example 3. In Example 5, the surface free energy was changed in an even shorter time than in Example 4 by heating during UV irradiation.

Thus, a transistor that exhibited excellent characteristics was obtained with a smaller amount of UV irradiation by heating polyimide A, which had two photo-functional sites in the side chain and a dendrimer structure, than when no heating was applied.

Reference Example 2

A 5 wt % NMP solution of polyimide A was mixed with a 8 wt % NMP solution of polyimide CT4112 (from Kyocera Chemical Corporation), which had a higher insulating property than polyimide A, at the weight ratio of 5:95, thereby preparing a sample solution A. A 5 wt % NMP solution of polyimide B was also mixed with an 8 wt % NMP solution of polyimide CT4112 (Kyocera Chemical Corporation), which had a higher insulating property than polyimide B, at the weight ratio of 5:95, thereby preparing a sample solution B.

Then, a glass substrate was spin-coated with sample solution A or sample solution B. After prebake with a hot plate at 80° C., the solvent was removed at 180° C., thereby forming a wettability variable layer. The thickness of the wettability variable layer was determined by the stylus method to be 500 nm in each case. Each wettability variable layer was then irradiated with UV light with a wavelength of 300 nm or smaller. The contact angle of water and a silver nano-ink with respect to the irradiation time was determined by the drop method.

Figure 5:
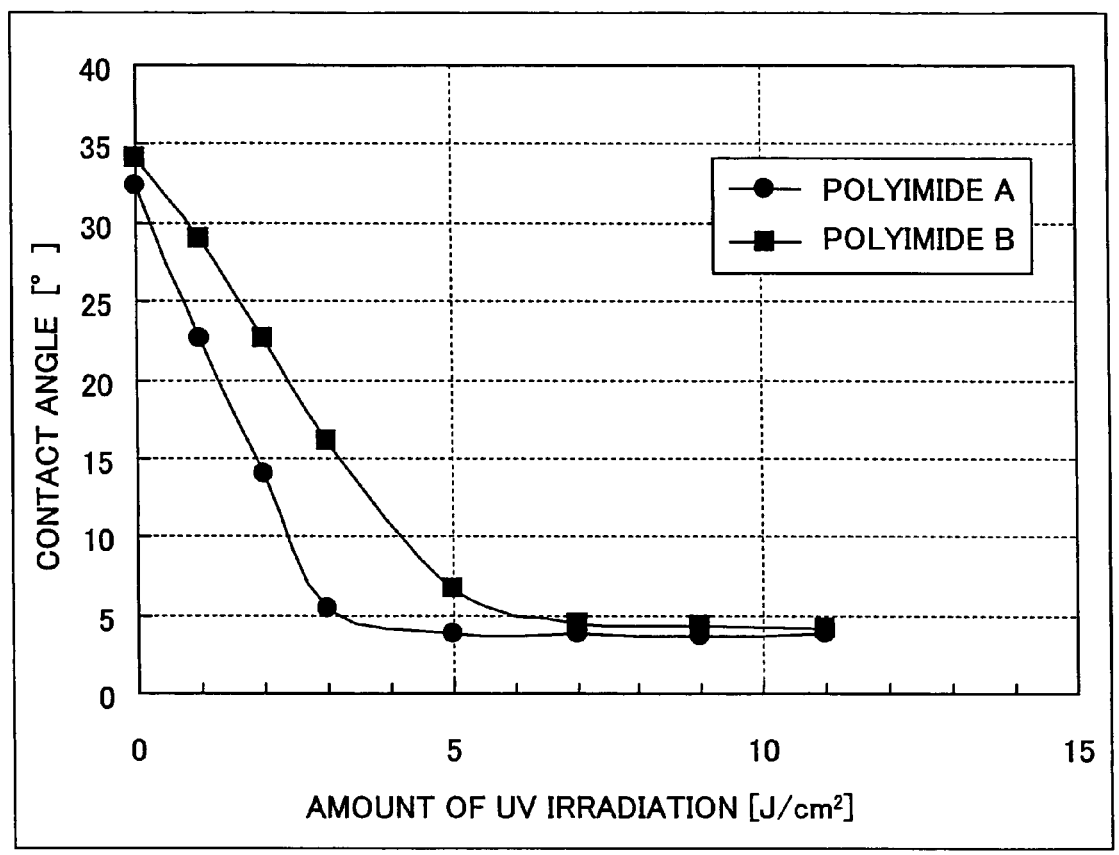
FIG. 5 shows how the contact angle changes with respect to the amount of UV irradiation in Reference Example 2.

The result for the silver nano-ink is shown in FIG. 5. It can be seen from the table that sufficient changes in contact angle, i.e., surface free energy, were also obtained by UV irradiation in the cases where thin-films are fabricated from solutions containing polyimide A or polyimide B and a polyimide that had a higher insulating property than polyimide A or B. However, the amount of UV irradiation necessary to obtain the same contact angle was smaller for polyimide A, or approximately half the amount for polyimide B.

Thus, with polyimide A, which had two photo-functional sites in the side chain, a surface was obtained that had a small contact angle, i.e., a large surface free energy, with a smaller amount of UV irradiation than with polyimide B, which had one photo-functional site in the side chain.

Example 6, Comparative Example 8

On a glass substrate, a gate electrode of aluminum with a film thickness of 50 nm was formed by vacuum deposition involving a metal mask. Then, sample solution A (Example 6) or sample solution B (Comparative Example 8) was spin-coated thereon, followed by baking as in Reference Example 2, thereby forming a wettability variable layer. Furthermore, via a photomask having a lined pattern with 5 μm intervals, irradiation of UV light with a wavelength of 300 nm or smaller was conducted with an irradiation amount of 1 to 15 J/cm², whereby a high surface energy portion was formed on the wettability variable layer. Then, ultrasonic cleaning was conducted in an aqueous solution of neutral detergent, followed by washing with ultrapure water and then drying sufficiently in an oven at 120° C. Thereafter, a silver nano-ink was discharged onto the high surface energy portion by ink jet method, and baking was performed in an oven at 200° C. The electrode line patterning property was then evaluated as in Example 1.

The evaluation result is shown in Table 6.

TABLE 6

| | Amount of UV irradiation (J/cm²) | | | | |
|---|---|---|---|---|---|
| | 1 | 3 | 5 | 10 | 15 |
| Ex. 6 | Bad | Good | Excellent | Excellent | Excellent |
| Comp. Ex. 8 | Bad | Bad | Poor | Excellent | Excellent |

This result corresponds well to the relationship between the amount of UV irradiation and contact angle obtained with regard to Reference Example 2. Namely, in Example 6, since a high surface energy portion was formed with the amount of UV irradiation of 3 J/cm² and the portion that had not been irradiated with UV light had a low surface free energy (i.e., a large contact angle), the boundary was clearly delineated, thus making it possible to form the electrode lines at 5 μm intervals. On the other hand, in Comparative Example 8, a high surface energy portion could not be formed with the amount of UV irradiation of 5 J/cm², so that a sufficient contrast of surface free energy could not be obtained, resulting in portions with a lack of formation of the electrode lines at 5 μm intervals.

Thus, with polyimide A, which had two photo-functional sites in the side chain, the electrode lines were formed at 5 μm intervals with a smaller amount of UV irradiation than with polyimide B, which had one photo-functional site in the side chain.

Example 7, Comparative Example 9

The electrode line patterning property was evaluated in the same way as in Example 6 and Comparative Example 8 with the exception that, via a photomask having a lined pattern of 1 to 20 μm intervals, irradiation UV light (from an extra high pressure mercury lamp) having a wavelength of 300 nm or smaller was conducted with an irradiation amount of 4 J/cm². The evaluation result is shown in Table 7.

TABLE 7

| | Intervals of electrode lines (μm) | | | | | |
|---|---|---|---|---|---|---|
| | 1 | 2 | 3 | 5 | 10 | 20 |
| Ex. 7 | Bad | Poor | Excellent | Excellent | Excellent | Excellent |
| Comp. Ex. 9 | Bad | Bad | Poor | Poor | Excellent | Excellent |

This result corresponds well with the relationship between the amount of UV irradiation and contact angle with regard to Reference Example 2. Namely, in Example 7, the high surface energy portion was formed at 3 μm intervals, thus making it possible to form the electrode lines. On the other hand, in Comparative Example 9, the high surface energy portion could not be formed unless at approximately 10 μm intervals, with the result that a sufficient contrast could not be obtained and portions lacking in formation of the electrode lines were conspicuous.

Thus, with polyimide A, which had two photo-functional sites in the side chain, the electrode lines were formed at narrower intervals than with polyimide B, which had one photo-functional site in the side chain.

Example 8, Comparative Example 10

Figure 6:
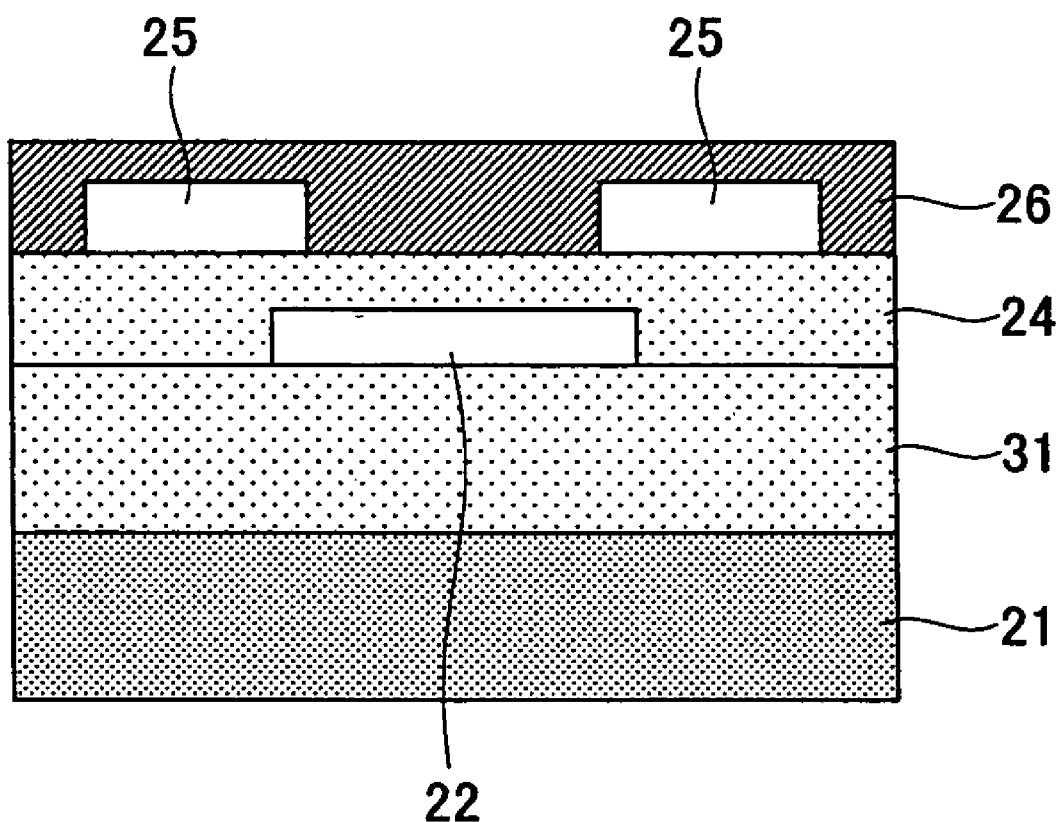
FIG. 6 shows an organic transistor according to Example 8.

A film substrate 21 was spin-coated with an NMP solution of polyimide D, thereby forming a wettability variable layer 31 with a film thickness of 50 nm. Then, via a photomask, irradiation of UV light (from an extra high pressure mercury lamp) with a wavelength of 300 nm or smaller was conducted with an irradiation amount of 3 J/cm², thereby forming a high surface energy portion on the wettability variable layer 31. Further, a silver nano-ink was discharged onto the high surface energy portion by the ink jet method, followed by baking at 180° C., forming a gate electrode 22 with a film thickness of 50 nm. On top of this, sample solution A (Example 8) or sample solution B (Comparative Example 10) was spin-coated, followed by baking as in Reference Example 2, whereby a wettability variable layer 24 (gate insulating film) with a thickness of 600 nm was formed. Thereafter, irradiation of UV light (from an extra high pressure mercury lamp) with a wavelength of 300 nm or smaller was conducted, via a photomask having a lined pattern at 5 μm intervals, with an irradiation amount of 4 J/cm² (Example 8) or 8 J/cm² (Comparative Example 10), thereby forming a high surface energy portion on the wettability variable layer 24. Further, a silver nano-ink was discharged onto the high surface energy portion by the ink jet method. This was followed by baking at 180° C., thereby forming source and drain electrodes 25. Then, as in Example 3, an organic semiconductor layer 26 was formed, thus fabricating an organic transistor (see FIG. 6).

The evaluation result of the transistor characteristics is shown in Table 8.

TABLE 8

| | Ex. 8 | Comp. Ex. 10 |
|---|---|---|
| On/off ratio | 5 digits | 4 digits |
| Field-effect mobility (cm²/V · sec) | $2 \times 10^{-3}$ | $7 \times 10^{-4}$ |

It is seen from Table 8 that in Example 8, the electrode patterning property was good and the organic transistor had a field-effect mobility of $2 \times 10^{-3}$ cm²/V·sec. This value is comparable to the corresponding value in the organic transistor according to Example 3.

In Comparative Example 10, the field-effect mobility was on the order of $10^{-4}$ cm²/V·sec. Further, the off-current was large and the on/off ratio was in four digits, which is approximately one order of magnitude smaller than Example 8. A detailed analysis showed that, in the organic transistor of Comparative Example 10, there was an increase in the gate leak over the organic transistor of Example 8. This result is inferred to be due to the difference in the amount of UV irradiation. Namely, in Comparative Example 10, approximately twice as long an UV irradiation, time was necessary as in Example 8 in order to form the source and drain electrodes. As a result, the wettability variable layer 24 was affected and the insulating property decreased. Consequently, it is believed, the gate leak increased and, as a result, the on/off ratio became smaller.

Thus, by mixing polyimide A, which had two photo-functional sites in the side chain, with a material having a higher insulating property than polyimide A, it became possible to form, with a single coating step, an insulating film which had a good insulating property and whose surface free energy greatly changed with a small amount of UV irradiation. Thus, a transistor that exhibited excellent characteristics was obtained.

Example 9

Figure 7A:
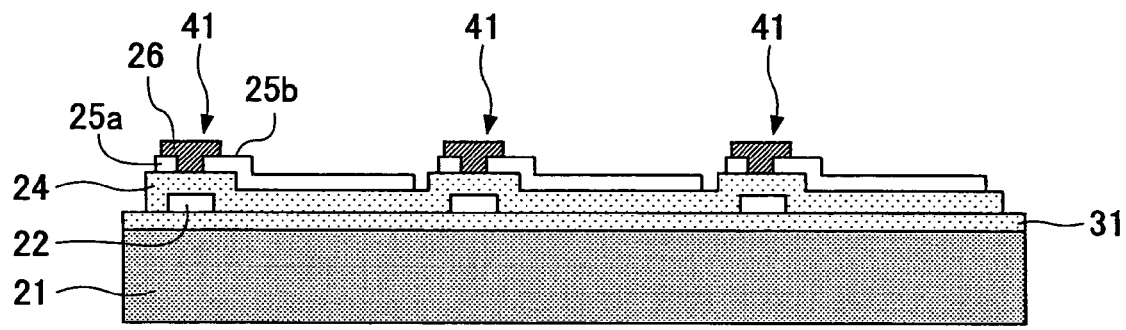
FIG. 7 shows an electronic device array according to Example 9.
Figure 7B:
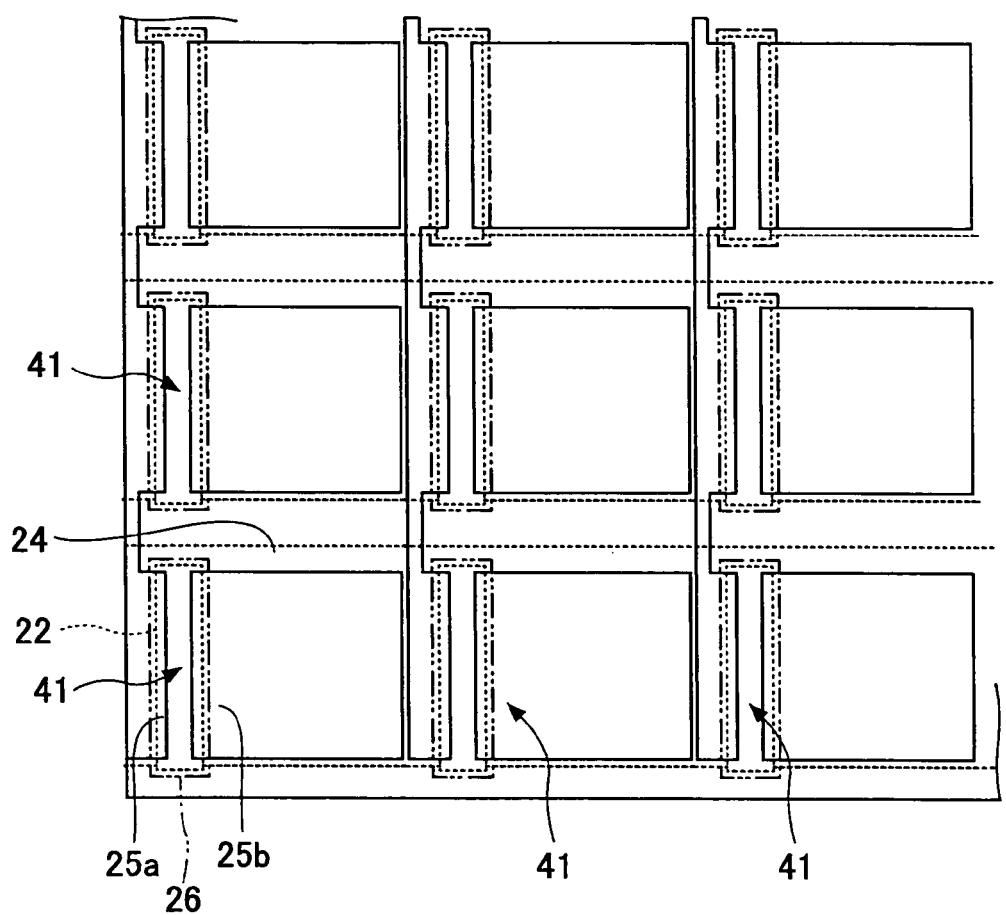

An electronic device array comprising plural electronic devices as in Example 8 was fabricated (see FIGS. 7A and 7B). FIG. 7A shows a cross-sectional view, and FIG. 7B shows a plan view. Specifically, an electronic device array comprising 200×200 (interelement pitch: 127 μm) organic transistors 41 on a substrate 21 in a two-dimensional array was fabricated. The average value of the mobility of the plural organic transistors 41 was $1.1 \times 10^{-3}$ cm$^2$/V·sec.

Example 10

Figure 8:
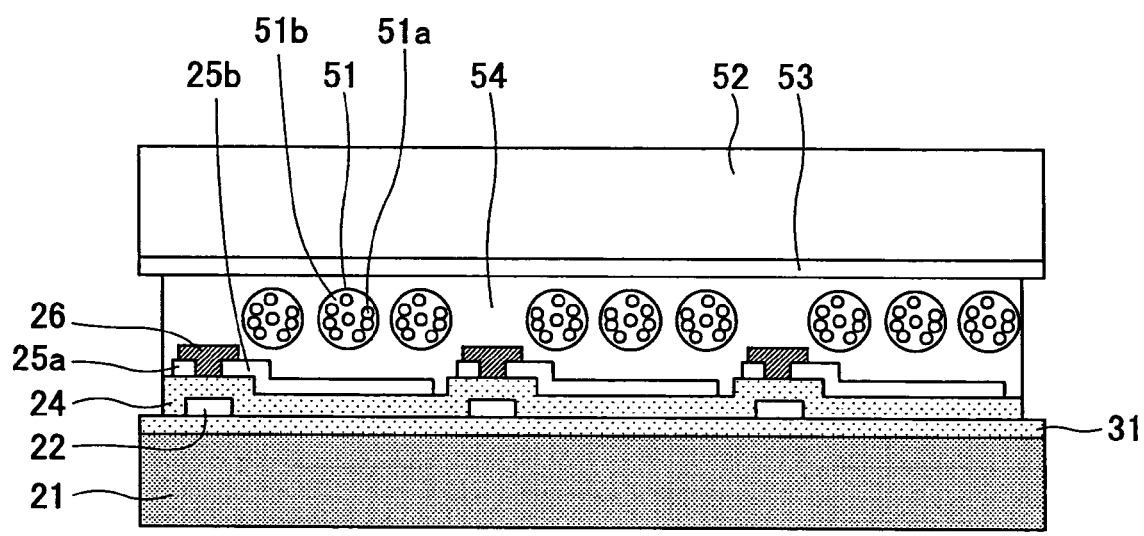
FIG. 8 shows a cross-sectional view of a display apparatus according to Example 10.

With the electronic device array shown in FIG. 7, a display apparatus was fabricated (see FIG. 8). Specifically, an application liquid consisting of a mixture of microcapsules (display elements) 51, which contained titanium oxide particles 51a and Isopars 51b colored with oil blue, and a polyvinyl alcohol (PVA) aqueous solution, was coated onto a transparent ITO electrode 53 and disposed on a polycarbonate substrate 52, thereby forming a layer comprising the microcapsules 51 and a PVA binder 54. The resultant substrate and the electronic device array shown in FIG. 7 were bonded to each other such that the substrates 21 and 52 were the outer-most surfaces. A driver IC for a scan signal was connected to a bus line connecting to the gate electrode 22, while a driver IC for a data signal was connected to a bus line connecting to the source electrode 25a. When screens were switched at 0.5 second intervals, good still-image display was performed.

The present application is based on the Japanese Priority Application No. 2007-065592 filed Mar. 14, 2007, the entire contents of which are hereby incorporated by reference.

The invention claimed is:

1. A laminate structure comprising a substrate on which a wettability variable layer and a conducting layer are disposed, the wettability variable layer containing a material whose critical surface tension changes upon application of energy, and the conducting layer being patterned on the wettability variable layer,
wherein the material with variable critical surface tension includes a main chain and a side chain,
the side chain having two or more sites of which the bond is cleaved upon absorption of the energy, and
wherein the side chain has a multi-branching structure.

2. The laminate structure according to claim 1, wherein each of the two or more sites of which the bond is cleaved has, independently, a functional group expressed by the structural formula:

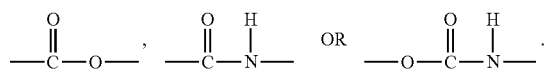

3. The laminate structure according to claim 1, wherein at least one of the two or more sites of which the bond is cleaved is linked with a conjugate structure.

4. The laminate structure according to claim 1, wherein the side chain has a hydrophobic group.

5. The laminate structure according to claim 1, wherein the main chain comprises polyimide.

6. The laminate structure according to claim 5, wherein the polyimide comprises a soluble polyimide.

7. The laminate structure according to claim 1, wherein the wettability variable layer has an insulating property.

8. The laminate structure according to claim 1, further comprising a semiconductor layer.

9. The laminate structure according to claim 8, wherein the semiconductor layer comprises an organic semiconductor material.

10. The laminate structure according to claim 1, further comprising an insulating layer having a higher insulating property than the wettability variable layer,
wherein the wettability variable layer is formed on the insulating layer.

11. The laminate structure according to claim 1, comprising plural of the wettability variable layers and plural of the conducting layers patterned on the wettability variable layers.

12. An electronic device comprising a laminate structure according to claim 1.

13. A laminate structure manufacturing method comprising:
a first step of forming a wettability variable layer on a substrate;
a second step of forming a high surface energy portion and a low surface energy portion by supplying energy to a predetermined region of the wettability variable layer formed on the substrate, thus changing the critical surface tension of the wettability variable layer; and
a third step of forming a conducting layer on the high surface energy portion by providing the high surface energy portion with a liquid containing an electrically conductive material;
wherein the wettability variable layer includes a material having a main chain and a side chain, the side chain having two or more sites of which the bond is cleaved upon absorption of the energy, and
wherein the side chain has a multi-branching structure.

14. The laminate structure manufacturing method according to claim 13, wherein the energy is supplied by UV irradiation.

15. The laminate structure manufacturing method according to claim 13, wherein the energy is supplied by heating.

16. The laminate structure manufacturing method according to claim 13, wherein the high surface energy portion is supplied with the liquid containing an electrically conductive material by an ink jet method.

17. The laminate structure manufacturing method according to claim 13, comprising plural of the first steps, the second steps and the third steps.

* * * * *